United States Patent
Hsu et al.

(10) Patent No.: US 7,099,219 B2
(45) Date of Patent: Aug. 29, 2006

(54) MULTI READ PORT BIT LINE

(75) Inventors: Steven K. Hsu, Lake Oswego, OR (US); Atul Maheshwari, Portland, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/018,012

(22) Filed: Dec. 20, 2004

(65) Prior Publication Data

US 2006/0133183 A1    Jun. 22, 2006

(51) Int. Cl.
G11C 7/02       (2006.01)
G11C 11/00      (2006.01)
G11C 11/34      (2006.01)
G11C 8/00       (2006.01)

(52) U.S. Cl. .............. 365/207; 365/154; 365/185.03; 365/185.21; 365/230.05

(58) Field of Classification Search .......... 365/207, 365/185.21, 230.05, 154, 185.03
See application file for complete search history.

(56) References Cited

U.S. PATENT DOCUMENTS

| 5,552,728 | A  | * | 9/1996  | Lin ............................ 327/57 |
| 6,414,520 | B1 | * | 7/2002  | Dupcak et al. .............. 327/52 |
| 6,714,455 | B1 | * | 3/2004  | Banks ................... 365/185.22 |
| 6,847,569 | B1 | * | 1/2005  | Sinha et al. ................ 365/207 |
| 6,961,266 | B1 | * | 11/2005 | Chang ................... 365/185.03 |
| 2002/0186312 | A1 | * | 12/2002 | Stark ......................... 348/302 |

OTHER PUBLICATIONS

Igor Arsovski, "High-Speed Low-Power Sense Amplifier Design," reading assignment for Analog Electronics, Course No. ECE1352, University of Toronto, 14 pages, Nov. 12, 2001.

\* cited by examiner

Primary Examiner—Amir Zarabian
Assistant Examiner—Anthan Tran
(74) Attorney, Agent, or Firm—Erik R. Nordstrom

(57) ABSTRACT

In some embodiment, a circuit is provided that comprises a bit line and bit cells coupled to the bit line. The bit line has an impedance. The bit cells, when operated, are each capable of adjusting the bit line impedance to indicate a stored bit value and a selected one of at least two read ports. Other embodiments are described or otherwise claimed herein.

28 Claims, 3 Drawing Sheets

Truth Table For Read Line Driver

| Clk | Port 1 Sel. | Port 2 Sel. | Rd. Sel. Line |
|---|---|---|---|
| 0 | X | X | 0 |
| 1 | 1 | 0 | $V_{rf1}$ |
| 1 | 0 | 1 | $V_{rf2}$ |
| 1 | 1 | 1 | Not Allowed |

FIGURE 2A

Output Truth Table With Ports 1 and 2 Selected

| Cell A (Port1) | Cell B (Port 2) | BL | P1 Out | P2 Out |
|---|---|---|---|---|
| 0 | 0 | $I_0$ | 0 | 0 |
| 0 | 1 | $I_1$ | 0 | 1 |
| 1 | 0 | $I_2$ | 1 | 0 |
| 1 | 1 | $I_3$ | 1 | 1 |

FIGURE 2B

Output Truth Table With Only Port 1 Selected

| Cell A (Port1) | BL | P1 Out | P2 Out |
|---|---|---|---|
| 0 | $I_0$ | 0 | 0 |
| 1 | $I_2$ | 1 | 0 |

FIGURE 2C

Output Truth Table With Only Port 2 Selected

| Cell A (Port2) | BL | P1 Out | P2 Out |
|---|---|---|---|
| 0 | $I_0$ | 0 | 0 |
| 1 | $I_1$ | 0 | 1 |

FIGURE 2D

MULTI READ PORT BIT LINE

TECHNICAL FIELD

Embodiments disclosed herein relate generally to integrated circuit ("IC") devices and in particular to memory circuits that may be employed in such devices.

BACKGROUND

Multi-ported data structures such as register files are commonly used in integrated circuit ("IC") chips such as microprocessor chips. (As used herein, the term "chip" [or die] refers to a piece of a material, such as a semiconductor material, that includes a circuit such as an integrated circuit or a part of an integrated circuit.) In fact, in some register file circuits, there is a need for several or many read ports. For example, in a microprocessor, a register file could have 12 or more read ports with the demand for more ever-growing. Unfortunately, increasing read ports takes up valuable space and power since each additional port can require its own metal track for each row select line and bit line, its own row select driver, and/or its own sense amplifier.

BRIEF DESCRIPTION OF THE DRAWINGS

Embodiments of the invention are illustrated by way of example, and not by way of limitation, in the figures of the accompanying drawings in which like reference numerals refer to similar elements.

FIGS. 2A through 2D show truth tables indicating operating embodiments for the register circuit of FIG. 1.

DETAILED DESCRIPTION

Figure 1:
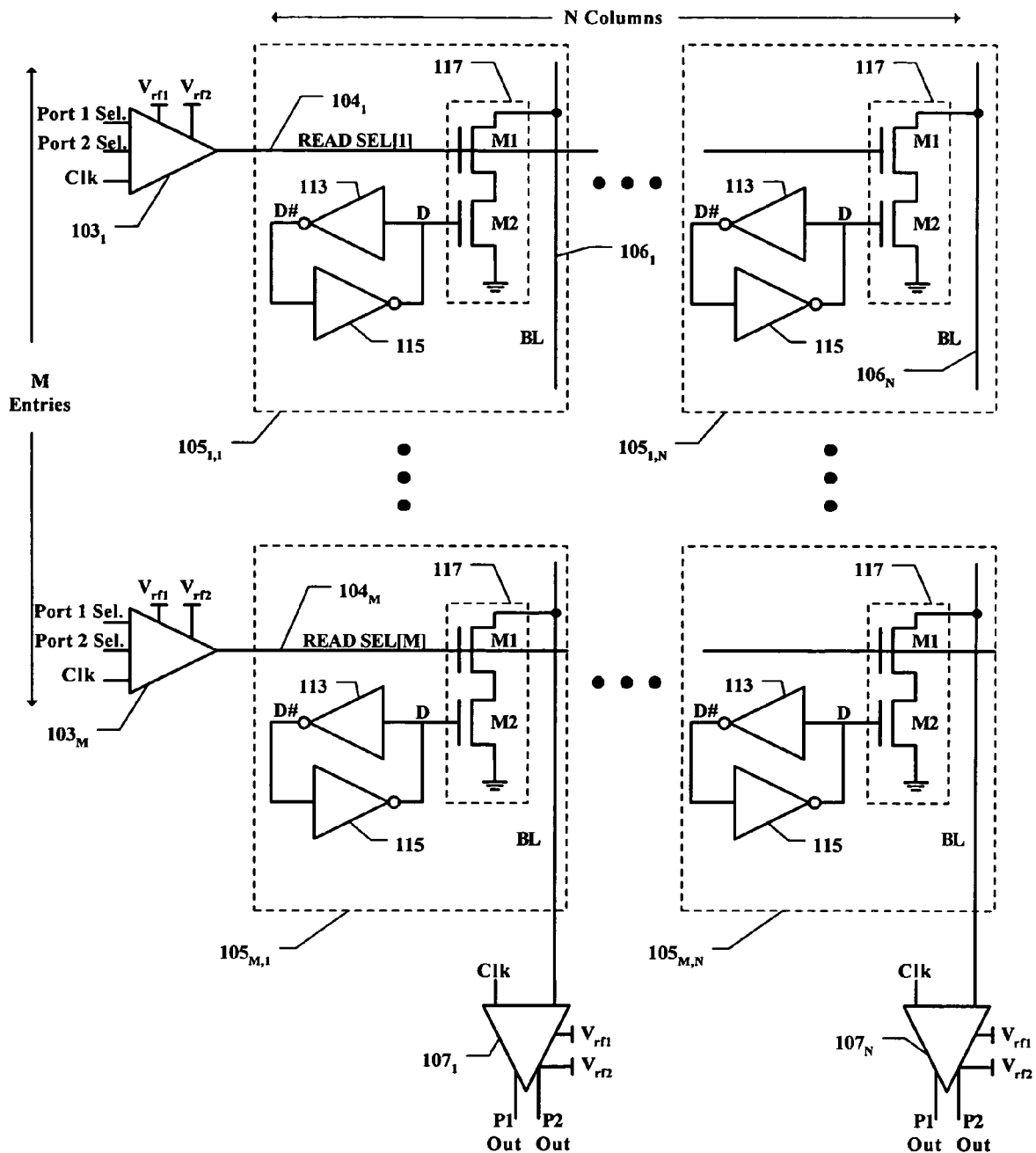
FIG. 1 is a schematic diagram of a portion of a register according to some embodiments of the present invention.

FIG. 1 shows an embodiment of a relevant portion of a register file circuit. The depicted circuit generally comprises multi-level read line drivers $103_1$ through $103_M$, read select lines $104_1$ through $104_M$, bit cells $105_{1,1}$ through $105_{M,N}$, bit lines (BL) $106_1$ through $106_N$, and sense amplifiers $107_1$ through $107_N$. The bit cells 105 are arranged in an M by N array with M rows (or entries) and N columns. In the depicted embodiment, each column comprises M bit cells 105 coupled to a common bit line 106, which in turn is coupled to an associated sense amplifier 107. For each bit cell row, a read line driver 103 is coupled to an associated read select line 104, which in turn, is coupled to N bit cells 105. (It should be appreciated that other register file bit cell array embodiments could consist of a single row or column of bit cells or multiple rows and/or columns of bit cells with possibly unequal numbers of bit cells in the row and/or columns. In addition, in this embodiment, a sense amplifier 107 is provided for each bit line. In other embodiments, however, a single sense amplifier could be used with multiple bit lines, e.g., by multiplexing the several bit lines to an associated sense amplifier. Also, while a single bit line is shown for each bit cell column, it should be appreciated that in other embodiments, multiple bit lines, each with one or more read ports as taught herein, could be used with a bit cell column.)

A multi-level read line driver may comprise any suitable circuit for controllably providing onto a read select line a read select line signal at one of at least three different states (or levels) for controlling the bit cells 105 in its associated row. The depicted read line driver 103 comprises a decoder driver circuit having first and second read port select (Port 1 Sel., Port 2 Sel.) signal inputs, a clock (Clk) signal input, and two different voltage reference ($V_{rf1}$, $V_{rf2}$) inputs. It comprises suitable (e.g., decoder/pass gate) circuitry for applying at the read select line (READ SEL) output an inactive Low (e.g., at or near ground), a first active voltage at $V_{rf1}$, or a second active voltage at $V_{rf2}$, depending on the states of the input signals.

With additional reference to FIG. 2A, a truth table for the read select line signal is shown. When the clock signal is de-asserted (e.g., Low), the Read driver outputs onto the read select line an inactive state signal, regardless of the values of the read port select signals. On the other hand, when the clock signal and one of the read port select signals are asserted, the read line driver 103 outputs onto the read select line one of two active state signals, $V_{rf1}$ or $V_{rf2}$, depending, respectively, on whether the Port 1 Sel. or Port 2 Sel. signal is asserted. In this embodiment, both read port select signals cannot be asserted at the same time and if neither is asserted, the read select line output is inactive. Thus, the depicted read line drivers 103 output a signal in one of three different states: one inactive state and two different active states ($V_{rf1}$, $V_{rf2}$). While the values of $V_{rf1}$ and $V_{rf2}$ could be any suitable voltage, in this embodiment, they are $2V_{cc}$ and $V_{cc}$, respectively.

The depicted bit cell 105 generally comprises a data storage portion formed from cross-coupled inverters 113/115 and a multi-level bit line gate 117. The multi-level bit line gate 117 serves to controllably adjust bit line impedance by an amount that is based on (i) the state of its associated read select line signal, and (ii) the stored value in its associated bit cell.

The cross-coupled inverter pair 113/115 has complementary data storage nodes, D and D#, for storing readable and writeable digital data. Note that while a cross-coupled inverter pair is commonly used for implementing a data storage circuit in a bit cell, any other suitable circuit configuration for readably and writably storing a bit could also be used. Likewise, any suitable circuit for implementing an inverter could be used. For example, an inverter could be formed from an NMOS transistor and a PMOS transistor configured with their gates and sources commonly connected to one another. (The term "NMOS transistor" refers to an N-type metal oxide semiconductor field effect transistor. Likewise, the term "PMOS transistor" refers to a P-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner, and other suitable transistor types, known today or not yet developed, could be used in their place.)

A multi-level bit line gate may comprise any suitable circuit for controllably adjusting bit line impedance by an amount that is based on (i) the state of its associated read select line signal, and (ii) the stored value in its associated bit cell. The depicted multi-level bit line gate 117 is formed from stacked NMOS transistors M1 and M2 coupled between its associated bit line and a ground. The gate of M1 is coupled to its associated read select line, and the gate of M2 is coupled to a data storage node (D) from the storage portion of its bit cell 105. In this embodiment, the multi-level bit line gate 117 adjusts the impedance of its associated bit line 106 by an amount corresponding to one of at least three different levels based on the state of the read select line (which controls M1) and its associated bit cell's stored value (which controls M2). In some embodiments, transistor M1 is made so that it turns off (or at least turns on to a relatively small amount) when the inactive signal (e.g., at or near ground) is applied, turns on to a relatively large amount when $V_{rf1}$ is applied, and turns on to a relatively medium amount when $V_{rf2}$ is applied. Likewise, in some embodiments, transistor M2 is made so that it turns on to a relatively large amount when the stored bit cell value (D) is High and turns off (or at least on to a relatively small amount) when the stored bit cell value is Low. (Note that "turned on" and "turned off" are relative terms. When a transistor is said to be turned off, it may actually be on, or conducting, but "on" less than when it is said to be "turned on.")

Thus, for a bit cell 105, depending on its stored value (D) and the state (or level) of its read select line, its bit line can be adjusted by one of three distinct impedances corresponding to three different, relative bit line current states: $I_0$, $I_1$, and $I_2$. In the depicted embodiment, the first bit line state (highest impedance, current=$I_0$) occurs if either M1 is turned off (read select line inactive) or if M2 is turned off (bit cell storing Low value). The second state (lower impedance, current=$I_1$) occurs when M2 is turned on (bit cell value is High) and M1 is driven by $V_{rf2}$ (port 2 selected). Finally, the third state (lower impedance, current=$I_2$) occurs when M2 is turned on (bit cell value is High) and M1 is driven by $V_{rf1}$ (port 1 selected). (Note that $I_2 > I_1 > I_0$.) When a second bit cell on the same bit line (i.e., in the same column) is simultaneously activated (albeit with a different port selected), then the bit line impedance can be reduced even further when both bit cells store a High value. This results in a fourth overall state (even lower impedance, current=$I_3$, where $I_3 > I_2 > I_1 > I_0$). As will be discussed below, these four different bit line states can be used for simultaneously reading two selected bit cells on the same bit line.

The multi-level sense amplifier 107 is coupled to an associated bit line 106 to read one or more bit cells 105 on the bit line. It could comprise any suitable circuit for sensing and distinguishing between the previously mentioned four different bit line impedance (or current) states and mapping, from the sensed state, the stored value(s) for the one or more selected bit cells. In the depicted embodiment, multi-level sense amplifier 107 is a multi-level current mode sense amplifier with reference voltage inputs ($V_{rf1}$, $V_{rf2}$, which are the same a those applied to the read line drivers 103) and first and second read port outputs (P1 Out, P2 Out) for indicating the digital values of the one or two selected bit cells on the bit line. The two reference voltages may be used to generate reference currents to be compared with a bit line current generated by the sense amplifier 107. The sense amplifier could include one or more amplifier circuits such as differential amplifier circuits to implement comparator circuitry for this purpose. Based on the determined current (i.e., $I_3$, $I_2$, $I_1$, or $I_0$), appropriate digital values could then be applied at the read port outputs (P1 Out and P2 Out).

FIG. 2B shows a truth table indicating read port output values when two bit cells (cell A and cell B) on a common bit line are selected for the register file circuit of FIG. 1. "Cell A" and "Cell B" generically represent any two common-bit line cells. In this example, port 1 is selected for cell A, while port 2 is selected for cell B. (The Port 1 Sel. input would be asserted for the read line driver of cell A, and the Port 2 Sel. input would be asserted for the read line driver of cell B.) As indicated in the truth table, each of the four cell data combinations corresponds to a unique one of the aforementioned current states: $I_0$, $I_1$, $I_2$, or $I_3$. As discussed above, the currents are correspondingly mapped to the outputs: "P1 Out" and "P2 Out" to indicate the proper cell data values. Note that as reflected in FIGS. 2C and 2D, the scheme functions equally well with only one of the ports selected.

Accordingly, with the register file of FIG. 1, one cell can be read or two cells may be read simultaneously using a single bit line and sense amplifier. This is beneficial because consumed space otherwise used for an extra read select line, bit line, and/or sense amplifier, can be saved for each read select line/bit line combination in a register file.

Figure 3:
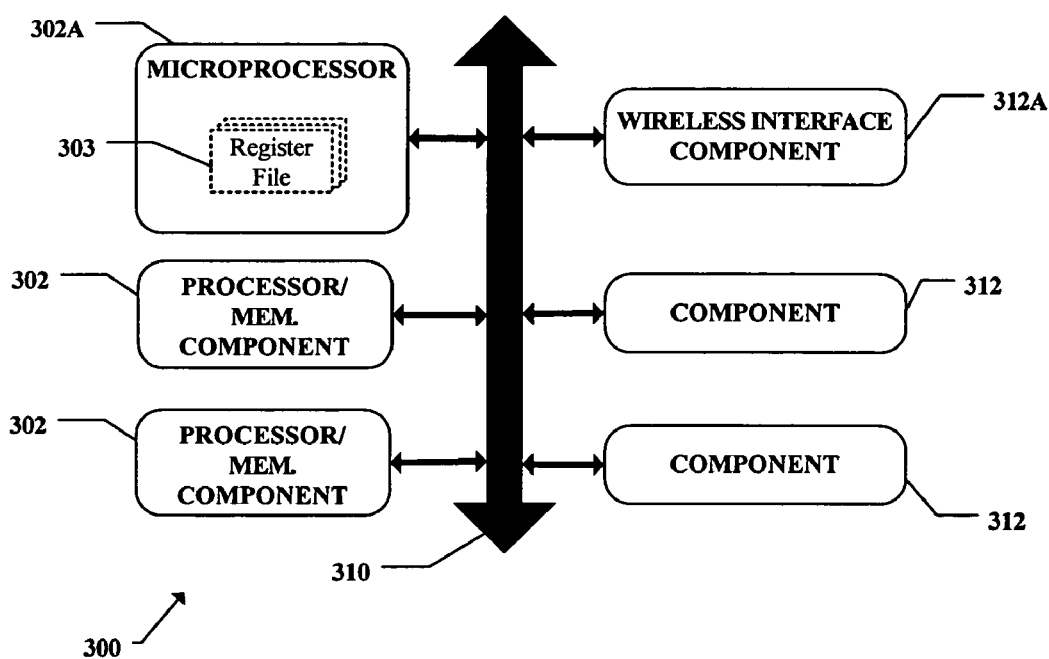
FIG. 3 is a block diagram of a system having a processor chip with a register in accordance with some embodiments of the present invention.

With reference to FIG. 3, one example of a system (system 300 for a computer) that may be implemented with one or more IC chips or modules (including a microprocessor chip 302A) is shown. System 300 generally comprises one or more processor/memory components 302, an interface system 310, and one or more other components 312. At least one of the one or more processor/memory components 302 is communicatively linked to at least one of the one or more other components 312 through the interface system 310, which comprises one or more interconnects and/or interconnect devices including point-to-point connections, shared bus connections, and/or combinations of the same.

A processor/memory component is a component such as a processor, controller, memory array, or combinations of the same contained in a chip or in several chips mounted to the interface system or in a module or circuit board coupled to the interface system. Included within the depicted processor/memory components is microprocessor chip 302A, which has one or more register file circuits 803 in accordance with an embodiment of the invention, as disclosed herein. The one or more depicted other components 312 could include any component of use in a computer system such as a sound card, network card, Super I/O chip, or the like. In the depicted embodiment, the other components 312 include a wireless interface component 312A, which serves to establish a wireless link between the microprocessor 302A and another device such as a wireless network interface device or a computer. It should be noted that the system 300 could be implemented in different forms. That is, it could be implemented in a single chip module, a circuit board, or a chassis having multiple circuit boards. Similarly, it could constitute one or more complete computers or alternatively, it could constitute a component useful within a computing system.

While the inventive disclosure has been described in terms of several embodiments, those skilled in the art will recognize that the invention is not limited to the embodiments described, but can be practiced with modification and alteration within the spirit and scope of the appended claims. For example, while the register file embodiments are primarily discussed in the context of processor chips, other types of chips (such as bus, transceiver, network, or any other chips using a register file) could employ a register file circuit as discussed herein.

It should be appreciated that example sizes/models/values/ranges may have been given, although the present invention is not limited to the same. As manufacturing techniques (e.g., photolithography) mature over time, it is expected that devices of smaller size could be manufactured. With regard to description of any timing or programming signals, the terms "assertion" and "negation" are used in an intended generic sense. More particularly, such terms are used to avoid confusion when working with a mixture of "active-low" and "active-high" signals, and to represent the fact that the invention is not limited to the illustrated/described signals, but can be implemented with a total/partial reversal of any of the "active-low" and "active-high" signals by a simple change in logic. More specifically, the terms "assert" or "assertion" indicate that a signal is active independent of whether that level is represented by a high or low voltage, while the terms "negate" or "negation" indicate that a signal is inactive. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
   (a) a bit line;
   (b) a plurality of bit cells each coupled to the bit line; and
   (c) a sense amplifier coupled to the bit line, said sense amplifier having first and second read ports and sensing at least four different impedance levels on the bit line to simultaneously read at least two of the bit cells and indicate their values at said first and second read ports.

2. The chip of claim 1, in which each bit cell, when selected, is capable of adjusting a bit line impedance by at least three different levels.

3. The chip of claim 2, in which the at least three different levels correspond to an inactive state and two different active states.

4. The chip of claim 3, in which the off state can result from a selected bit cell having a Low stored value.

5. The chip of claim 4, in which the off state can result from a bit cell not being selected.

6. The chip of claim 5, in which each bit cell is coupled to the bit line through a multi-level bit line gate.

7. The chip of claim 6, in which the multi-level bit line gate comprises first and second stacked transistors coupled between the bit line and a ground, the first transistor being coupled to a read select line.

8. The chip of claim 7, in which the second transistor is coupled to a data storage node of a storage portion of a bit cell.

9. The chip of claim 7, further comprising a multi level read select driver coupled to the read select line, said driver having first and second reference voltages, one of which is to be applied at the read select line when the bit cell is selected to be read.

10. The chip of claim 1, in which the sense amplifier is a multi-level current mode amplifier that compares bit line current with at least one reference current to perceive the bit line impedance from the at least four bit line impedances.

11. The chip of claim 10, in which the sense amplifier charges the bit line to generate a bit line current.

12. The chip of claim 1, in which the bit line, bit cells, and sense amplifier are part of a register file circuit.

13. A chip, comprising:
   a register file circuit comprising:
      (i) a bit line having an impedance;
      (ii) bit cells coupled to the bit line; and
      (iii) a sense amplifier coupled to the bit line, said sense amplifier sensing at least four different impedance levels on the bit line to read at least two of the bit cells during a single read operation.

14. The chip of claim 13, in which each bit cell comprises a multi-level bit line gate coupled to the bit line to adjust the bit line impedance.

15. The chip of claim 14, in which the bit line impedance can be adjusted by each bit cell by at least three different amounts.

16. The chip of claim 14, in which the multi-level bit line gate comprises first and second transistors coupled between the bit line and a ground.

17. The chip of claim 16, in which the first and second transistors are in series with one another.

18. The chip of claim 17, in which the first transistor is controlled by a read select line signal, and the second transistor is controlled by a data storage node of its associated bit cell.

19. The chip of claim 13, further comprising a multi-level, current mode sense amplifier coupled to the bit line, said sense amplifier having at least first and second read ports for simultaneously reading at least two of the bit cells.

20. A method comprising:
   (a) providing in a register file circuit at least one bit line having an impedance;
   (b) coupling a plurality of bit cells to the at least one bit line, wherein each bit cell, when operated, adjusts the bit line impedance to indicate a stored bit value and a selected one of at least two read ports; and
   (c) coupling the bit line to a sense amplifier that, when operated, simultaneously reads the stored bit values in at least two of the bit cells based on their adjustment of the bit line impedance.

21. The method of claim 20, in which the sense amplifier comprises at least two read ports to indicate the at least two read bit values.

22. The method of claim 20, further comprising providing a multi-level read select line driver coupled to each bit cell.

23. The method of claim 20, in which adjusting the bit line impedance comprises reducing it based on the stored bit value and the selected read port.

24. A system, comprising:
   (a) a microprocessor having a register file circuit comprising:
      (i) a bit line having an impedance;
      (ii) bit cells coupled to the bit line; and
      (iii) a sense amplifier coupled to the bit line, said sense amplifier sensing at least four different impedance levels on the bit line to read at least two of the bit cells during a single read operation; and
   (b) a wireless interface component communicatively linked to the microprocessor.

25. The system of claim 24, in which each bit cell comprises a multi-level bit line gate coupled to the bit line to adjust the bit line impedance.

26. The system of claim 25, in which the bit line impedance can be adjusted by each bit cell by at least three different amounts.

27. The system of claim 26, in which the multi-level bit line gate comprises first and second transistors coupled between the bit line and a ground.

28. The system of claim 27, in which the first and second transistors are in series with one another.

* * * * *